(12) United States Patent
Inoue (10) Patent No.: US 7,928,887 B2
(45) Date of Patent: Apr. 19, 2011

(54) ANALOG/DIGITAL CONVERSION DEVICE (75) Inventor: Fumihiro Inoue, Tama (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 221 days.

(21) Appl. No.: 12/377,423

(22) PCT Filed: Aug. 21, 2007

(86) PCT No.: PCT/JP2007/066212
§ 371 (c)(1),
(2), (4) Date: Feb. 13, 2009

(87) PCT Pub. No.: WO2008/026481
PCT Pub. Date: Mar. 6, 2008

(65) Prior Publication Data
US 2010/0225514 A1  Sep. 9, 2010

(30) Foreign Application Priority Data

Aug. 31, 2006  (JP) ................................ 2006-236025

(51) Int. Cl.
*H03M 1/38* (2006.01)
(52) U.S. Cl. ........................................ 341/161; 341/155
(58) Field of Classification Search .................. 341/155, 341/161, 172
See application file for complete search history.

(56) References Cited

U.S. PATENT DOCUMENTS

| 4,988,900 | A | * | 1/1991 | Fensch ........................... 327/337 |
| 5,323,158 | A | | 6/1994 | Ferguson, Jr. |
| 6,040,793 | A | | 3/2000 | Ferguson, Jr. et al. |
| 6,140,949 | A | * | 10/2000 | Tsay et al. ..................... 341/120 |
| 6,535,157 | B1 | | 3/2003 | Garrity et al. |
| 6,753,801 | B2 | * | 6/2004 | Rossi ............................. 341/161 |
| 6,970,126 | B1 | | 11/2005 | O'Dowd et al. |
| 7,777,663 | B2 | * | 8/2010 | Akizuki et al. ............... 341/172 |

FOREIGN PATENT DOCUMENTS

CN      1260639      7/2000

(Continued)

OTHER PUBLICATIONS

Furuta, M.; Kawahito, S.; Inoue, T.; Nishikawa, Y., "A cyclic A/D converter with pixel noise and column-wise offset canceling for CMOS image sensors", Proceedings of ESSCIRC 2005. 31st European Solid-State Circuits Conference, p. 411-414, 2005, Figs. 2, 4; p. 411, right column, line 11 to p. 412, right column, the last line.
Chris Binan Wang; "A 20-bit 25-kHz Delta-Sigma A/D Converter Utilizing a Frequency-Shaped Chopper Stabilization Scheme" IEEE Journal of Solid-State Circuits, IEEE Service Center, Piscataway, NJ, US, vol. 36, No. 3, Mar. 1, 2001, XP011061481 ISSN:0018-9200 *figure 3*.

(Continued)

*Primary Examiner* — Jean B Jeanglaude
(74) *Attorney, Agent, or Firm* — IPUSA, PLLC (57) ABSTRACT

An disclosed analog/digital conversion apparatus for converting an analog signal into digital data by cycling the analog signal through a fully differential amplifier circuit includes a polarity switching unit configured to switch connection polarities of the fully differential amplifier circuit; and a control unit configured to control the polarity switching unit in such a manner that the connection polarities of the fully differential amplifier circuit are switched between a first signal cycle and second and subsequent signal cycles.

5 Claims, 10 Drawing Sheets

FOREIGN PATENT DOCUMENTS

| | | |
|---|---|---|
| DE | 199 24 075 A | 12/1999 |
| JP | 04-156722 | 5/1992 |
| JP | 4 156722 A | 5/1992 |
| JP | 11-145830 | 5/1999 |
| JP | 2000201074 * | 7/2000 |
| JP | 2004-343292 | 12/2004 |
| JP | 2004-357279 | 12/2004 |
| WO | WO 94/27373 A1 | 11/1994 |
| WO | WO 2006/044755 A1 | 4/2006 |

OTHER PUBLICATIONS

Extended European Search Report.
Chinese Office Action dated Jan. 4, 2011.
European Office Action mailed Jan. 14, 2011.

* cited by examiner

| | | NUMBER OF AMPLIFICATIONS | | | |
|---|---|---|---|---|---|
| | | ONE | TWO | THREE | FOUR |
| PATTERN | PATTERN 1 | 1.91 TIMES | 3.65 TIMES | 6.97 TIMES | 13.31 TIMES |
| | PATTERN 2 | 2.1 TIMES | 4.41 TIMES | 9.26 TIMES | 19.45 TIMES |
| | PATTERN 3 | 1.91 TIMES | 4.01 TIMES | 7.66 TIMES | 16.09 TIMES |

ANALOG/DIGITAL CONVERSION DEVICE

TECHNICAL FIELD

The present invention is directed to an analog/digital conversion device, and in particular to an analog/digital conversion circuit for converting an analog signal into digital data by cycling the analog signal through a fully differential amplifier circuit.

BACKGROUND ART

Analog/digital conversion devices which have been proposed include pipeline analog/digital converters (see Patent Document 1, for example), algorithmic analog/digital converters (e.g. Patent Document 2) and cyclic analog/digital conversion circuits (e.g. Patent Document 3).

Among these devices, algorithmic analog/digital converters and cyclic analog/digital conversion circuits can be made relatively small in size and are therefore suitable for reducing an integrated circuit (IC) area.

Figure 13:
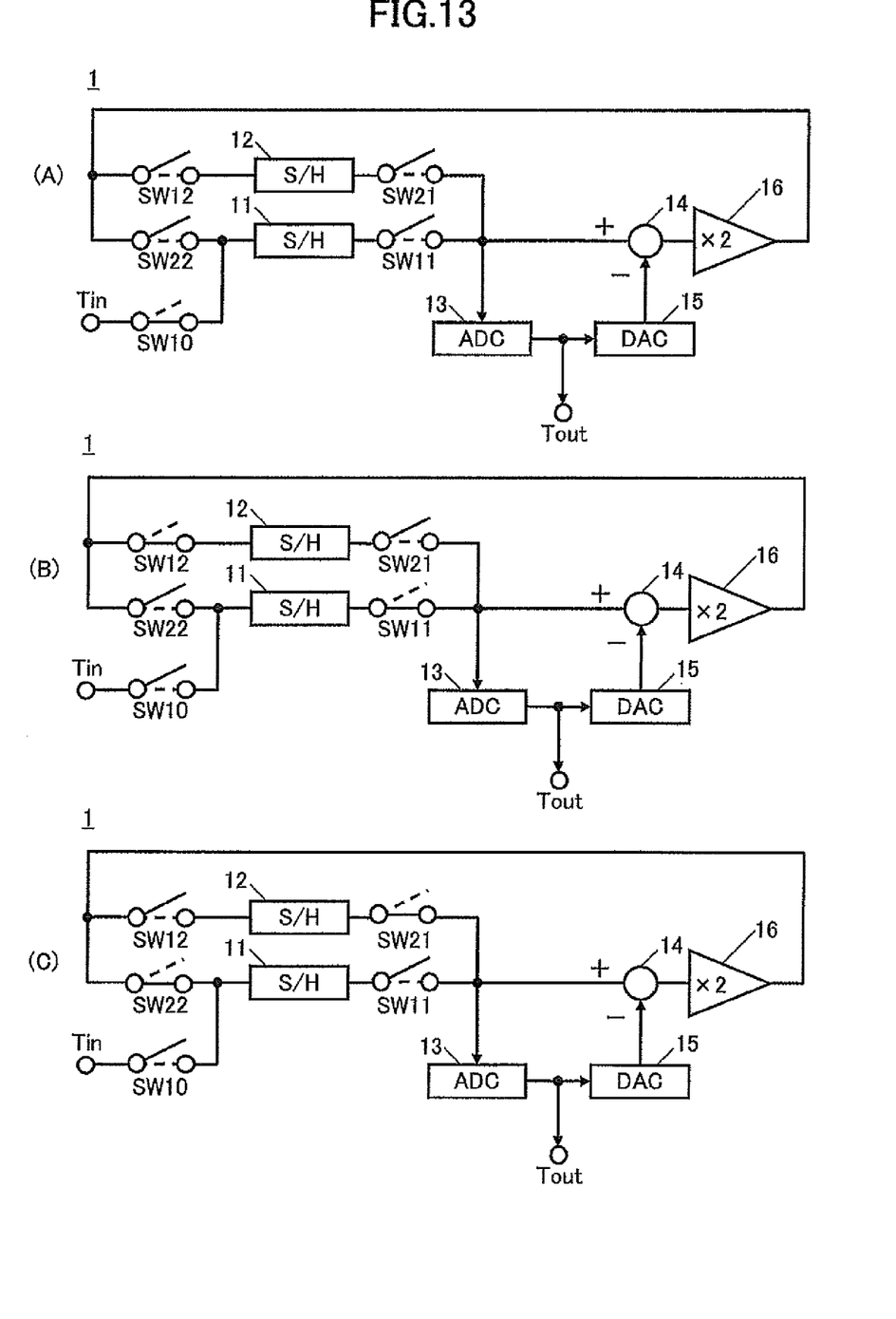
FIG. 13 shows block configuration diagrams related to an example of a conventional analog/digital converter.

FIG. 13 shows block diagrams related to an example of a conventional analog/digital converter (ADC).

An analog/digital conversion device 1 illustrated in FIG. 13 is an algorithmic ADC, and includes sample-and-hold circuits 11 and 12, a one-bit A/D conversion circuit 13, a subtraction circuit 14, a one-bit D/A conversion circuit 15, an amplifier circuit 16, and switches SW11, SW12, SW21 and SW22.

Next is described the operation of the algorithmic ADC.

First, as illustrated in FIG. 13(A), the switch SW10 is turned ON while the switches SW11, SW12, SW21 and SW22 are turned OFF, and the sample-and-hold circuit 11 samples an input signal.

Next, as illustrated in FIG. 13(B), the switch SW10 is turned OFF, the switches SW11 and SW12 are turned ON, and the switches SW21 and SW22 remain OFF. Accordingly, the input signal held by the sample-and-hold circuit 11 is supplied to the one-bit A/D conversion circuit 13. The one-bit A/D conversion circuit 13 converts the signal sampled and held by the sample-and-hold circuit 11 into a one-bit digital value. In this way, the most significant bit of a digital value for the conversion can be obtained.

Also, at this point, the signal sampled and held by the sample-and-hold circuit 11 is supplied to the subtraction circuit 14, at which a reference voltage $V_{ref}$ supplied from the one-bit D/A conversion circuit 15 in accordance with the one-bit digital value of the one-bit A/D conversion circuit 13 is subtracted from the sampled and held signal.

The one-bit D/A conversion circuit 15 supplies the reference voltage $V_{ref}$ to the subtraction circuit 14 in the case where the one-bit digital value of the one-bit A/D conversion circuit 13 is "1" and outputs no voltage (0 V) to the subtraction circuit 14 in the case where the one-bit digital value of the one-bit A/D conversion circuit 13 is "0".

In the case where the one-bit digital value of the one-bit A/D conversion circuit 13 is "1", the subtraction circuit 14 obtains a voltage by subtracting the reference voltage $V_{ref}$ from the sampled-and-held signal and supplies the obtained voltage to the amplifier circuit 16. In the case where the one-bit digital value of the one-bit A/D conversion circuit 13 is "0", the subtraction circuit 14 supplies to the amplifier circuit 16 the signal sampled and held by the sample-and-hold circuit 11 without change.

The amplifier circuit 16 amplifies twice the output of the subtraction circuit 14. At this point, since the switch SW12 is ON and the switch SW22 is OFF as shown in FIG. 13(B), the signal amplified by the amplifier circuit 16 is sampled and held by the sample-and-hold circuit 12.

When the signal amplified by the amplifier circuit 16 is sampled and held by the sample-and-hold circuit 12, the switches SW21 and SW22 are turned ON while the switches SW11 and SW12 are turned OFF, as illustrated in FIG. 13(C). Accordingly, the signal sampled and held by the sample-and-hold circuit 12 is subjected to a one-bit AD conversion. In addition, a second high order bit of the digital value for the conversion can be obtained.

The operational steps, as depicted in FIGS. 13(B) and 13(C), are repeated a number of times equal to the number of bits of the output digital data, whereby the input analog signal can be converted into digital data.

Thus, the algorithmic ADC converts an input analog signal into digital data by processing the aforementioned signal in a cyclic manner. In this manner, the algorithmic ADC is able to perform conversion operations with a minimum necessary circuit size using such a cyclic process, and the circuit size can, therefore, be reduced.

[Patent Document 1] Japanese Patent Publication No. 3765797

[Patent Document 2] Japanese Patent Publication No. 3046005

[Patent Document 3] Japanese Laid-open Patent Application Publication No. 2004-357279

DISCLOSURE OF THE INVENTION

Problems to be Solved by the Invention

However, although being able to minimize the circuit size with the use of the cyclic process, the conventional algorithmic ADC leaves the problem that the error becomes significant since effects of the input conversion offset of the amplifier circuit, capacity variation of the capacitors and the like are superimposed and increase, thus not allowing high-accuracy AD conversion.

In view of the above problem, the present invention aims at providing an analog/digital conversion device capable of improving conversion accuracy.

Means for Solving Problems

According to the present invention, an analog/digital conversion apparatus for converting an analog signal into digital data by cycling the analog signal through a fully differential amplifier circuit (113) includes a polarity switching unit (115) configured to switch connection polarities of the fully differential amplifier circuit (113); and a control unit (116) configured to control the polarity switching unit (115) in such a manner that the connection polarities of the fully differential amplifier circuit (113) are switched between a first signal cycle and second and subsequent signal cycles.

According to the present invention, the analog/digital conversion apparatus further includes a sample-and-hold circuit (111 and 112) configured to sample and hold the analog signal cycled through the fully differential amplifier circuit (113) and including multiple capacitors (C1 and C3; C2 and C4; C5 and C7; and C6 and C8) which are charged at the same potential and are connected to the fully differential amplifier circuit (113) at different connection points; and a capacitor switching unit (115) configured to switch the connection points of the multiple capacitors (C1 and C3; C2 and C4; C5 and C7; and C6 and C8). The control unit (116) controls the capacitor switching unit (115) in such a manner that the connection points of the multiple capacitors (C1 and C3; C2 and C4; C5 and C7; and C6 and C8) to the fully differential amplifier circuit (113) are different in each cycle.

In addition, according to the present invention, the analog/digital conversion apparatus is an algorithmic analog/digital conversion circuit.

According to the present invention, an analog/digital conversion apparatus for converting an analog signal into digital data includes a sample-and-hold circuit (111 and 112) including multiple capacitors (C1 and C3; C2 and C4; C5 and C7; and C6 and C8) which are charged at the same potential and configured to sample and hold the analog signal; a fully differential amplifier circuit (113) configured to amplify the analog signal sampled and held by the sample-and-hold circuit (111 and 112); an analog/digital conversion circuit (114) configured to convert the analog signal sampled and held by the sample-and-hold circuit (111 and 112) into a digital value in accordance with a reference voltage; a switching circuit (115) configured to switch connection points of the multiple capacitors (C1 and C3; C2 and C4; C5 and C7; and C6 and C8) in relation to the fully differential amplifier circuit (113); and a control unit (116) configured to control the switching circuit (115) in such a manner that connection polarities of the fully differential amplifier circuit (113) are switched between a first signal cycle and second and subsequent signal cycles.

The control unit (116) controls the switching circuit (115) in such a manner that the connection points of the multiple capacitors (C1 and C3; C2 and C4; C5 and C7; and C6 and C8) are different in each cycle.

Note that in the above paragraph, the reference numerals are provided exclusively for an ease of understanding, and it should be understood that this invention is not intended to be unduly limited by the illustrative embodiments.

Effect of the Invention

According to the present invention, an analog/digital conversion apparatus for converting an analog signal into digital data by cycling the analog signal through a fully differential amplifier circuit (113) includes a polarity switching unit (115) configured to switch connection polarities of the fully differential amplifier circuit (113); and a control unit (116) configured to control the polarity switching unit (115) in such a manner that the connection polarities of the fully differential amplifier circuit (113) are switched between a first signal cycle and second and subsequent signal cycles. According to this structure, even if the signal is cycled through the fully differential amplifier circuit (113) and amplified, an offset component of the fully differential amplifier circuit (113) can be reduced, which results in a reduction in error. In this manner, the present invention is able to improve AD conversion accuracy.

EXPLANATION OF REFERENCE SIGNS 100, 200 analog/digital conversion apparatus
111 first sample-and-hold circuit
112 second sample-and-hold circuit
113 differential amplifier circuit
114 one-bit analog/digital conversion circuit
115 switching circuit
116 controller
117 reference voltage generation circuit
118 clock generation circuit
211 1.5-bit ADC
212 memory
213 calculation unit
214 switching circuit
215 controller
216 reference voltage generation circuit

BEST MODE FOR CARRYING OUT THE INVENTION

Figure 1:
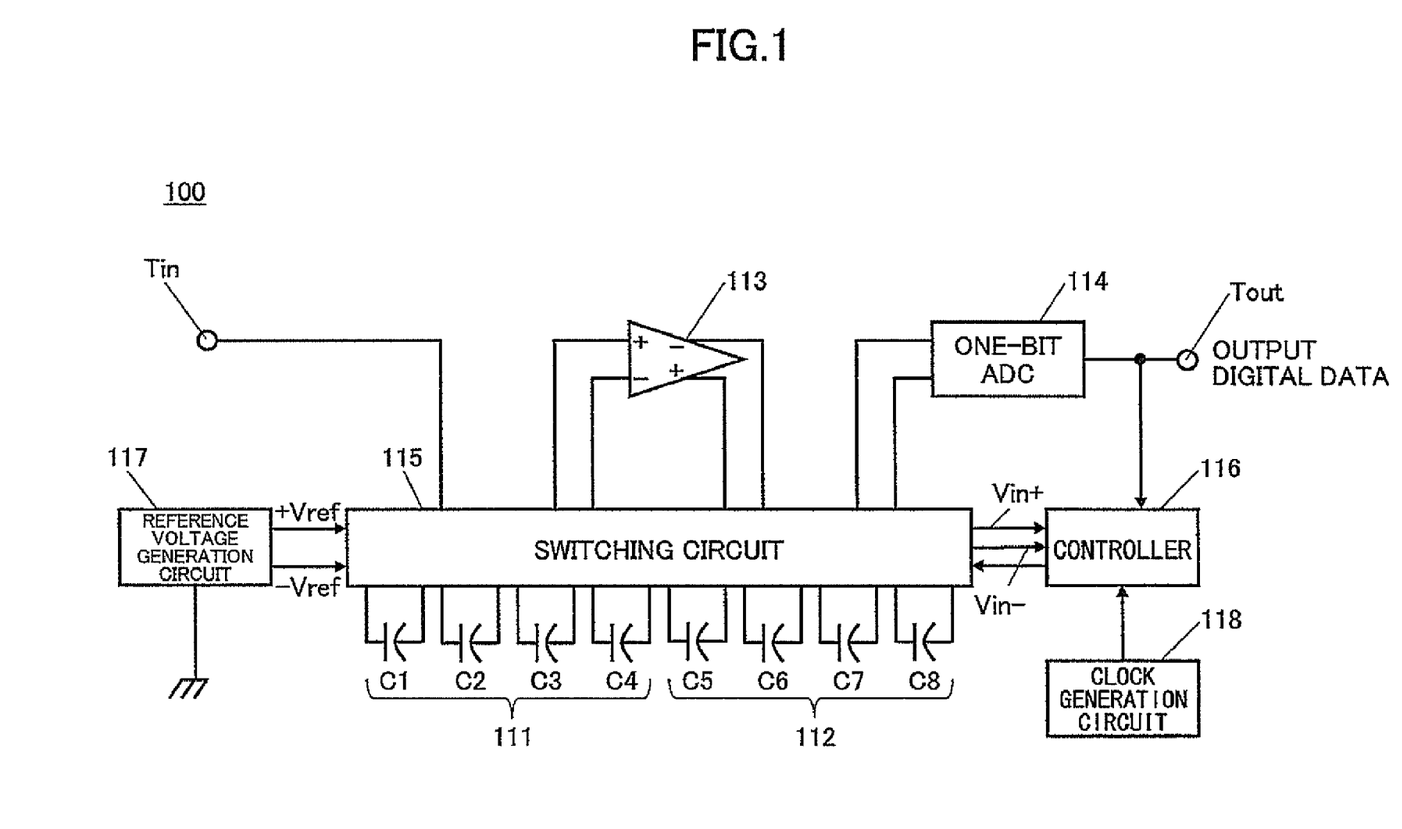
FIG. 1 is a block configuration diagram according to one embodiment of the present invention.

FIG. 1 is a block configuration diagram according to one embodiment of the present invention.

An analog/digital conversion device 100 of the present embodiment includes a first sample-and-hold circuit 111, a second sample-and-hold circuit 112, a differential amplifier circuit 113, a one-bit analog/digital conversion circuit 114, a switching circuit 115, a controller 116, a reference voltage generation circuit 117, and a clock generation circuit 118. The analog/digital conversion device 100 is a so-called algorithmic analog/digital conversion circuit.

The first sample-and-hold circuit 111 includes capacitors C1-C4, which are connected to the switching circuit 115. The capacitors C1 and C3 form a pair and are charged at the same potential. The capacitors C2 and C4 form a pair and are charged at the same potential. The paired capacitors C1 and C3 and the paired capacitors C2 and C4 are charged at the same time with opposite polarities.

The second sample-and-hold circuit 112 includes capacitors C5-C8, which are connected to the switching circuit 115. The capacitors C5 and C7 form a pair and are charged at the same potential. The capacitors C6 and C8 form a pair and are charged at the same potential. The paired capacitors C5 and C7 and the paired capacitors C6 and C8 are charged at the same time with opposite polarities.

The differential amplifier circuit 113 is a fully differential amplifier circuit, in which an inverting input terminal, a non-inverting input terminal, an inverted output terminal and a non-inverted output terminal are connected to the switching circuit 115. The capacitors C1-C4 and capacitors C5-C8 are connected to the differential amplifier circuit 113 via the switching circuit 115, and the differential amplifier circuit 113 differentially amplifies sampled and held signals and supplies the amplified signals to the one-bit analog/digital conversion circuit 114 via the switching circuit 115.

The one-bit analog/digital conversion circuit 114 is connected to the switching circuit 115, and compares either one of a signal sampled and held by the first sample-and-hold circuit 111 or a signal sampled and held by the second sample-and-hold circuit 112 supplied from the switching circuit 115 against a reference voltage $V_{ref}$ supplied from the reference voltage generation circuit 117. Then, the one-bit analog/digital conversion circuit 114 outputs, for example, "0" if the sampled and held signal is smaller than the reference voltage $V_{ref}$, and outputting "1" if the sampled and held signal is larger than the reference voltage $V_{ref}$.

The switching circuit 115 switches, based on a switching control signal from the controller 116, connections of the capacitors C1-C4 and the capacitors C5-C8, the inverting input terminal and the non-inverting input terminal of the differential amplifier circuit 113, and the inverted output terminal and the non-inverted output terminal of the differential amplifier circuit 113.

The controller 116 generates and supplies to the switching circuit 115 the switching control signal, which is used to control the switching circuit 115, in accordance with a clock supplied by the clock generation circuit 118. The controller 116 controls the switching circuit 115 in such a manner that the connection polarities of the differential amplifier circuit 113 are switched between the first signal cycle and the second and subsequent signal cycles. Also, the controller 116 controls the switching circuit 115 in such a manner that, at the input terminal of the differential amplifier circuit 113, connection points of the capacitors C1 and C2 and the capacitors C3 and C4, or connection points of the capacitors C5 and C6 and the capacitors C7 and C8 are different in each cycle.

The clock generation circuit 118 oscillates at a predetermined frequency and supplies a clock signal to the controller 116. The controller 116 is driven based on the clock signal supplied from the clock generation circuit 118.

Figure 2:
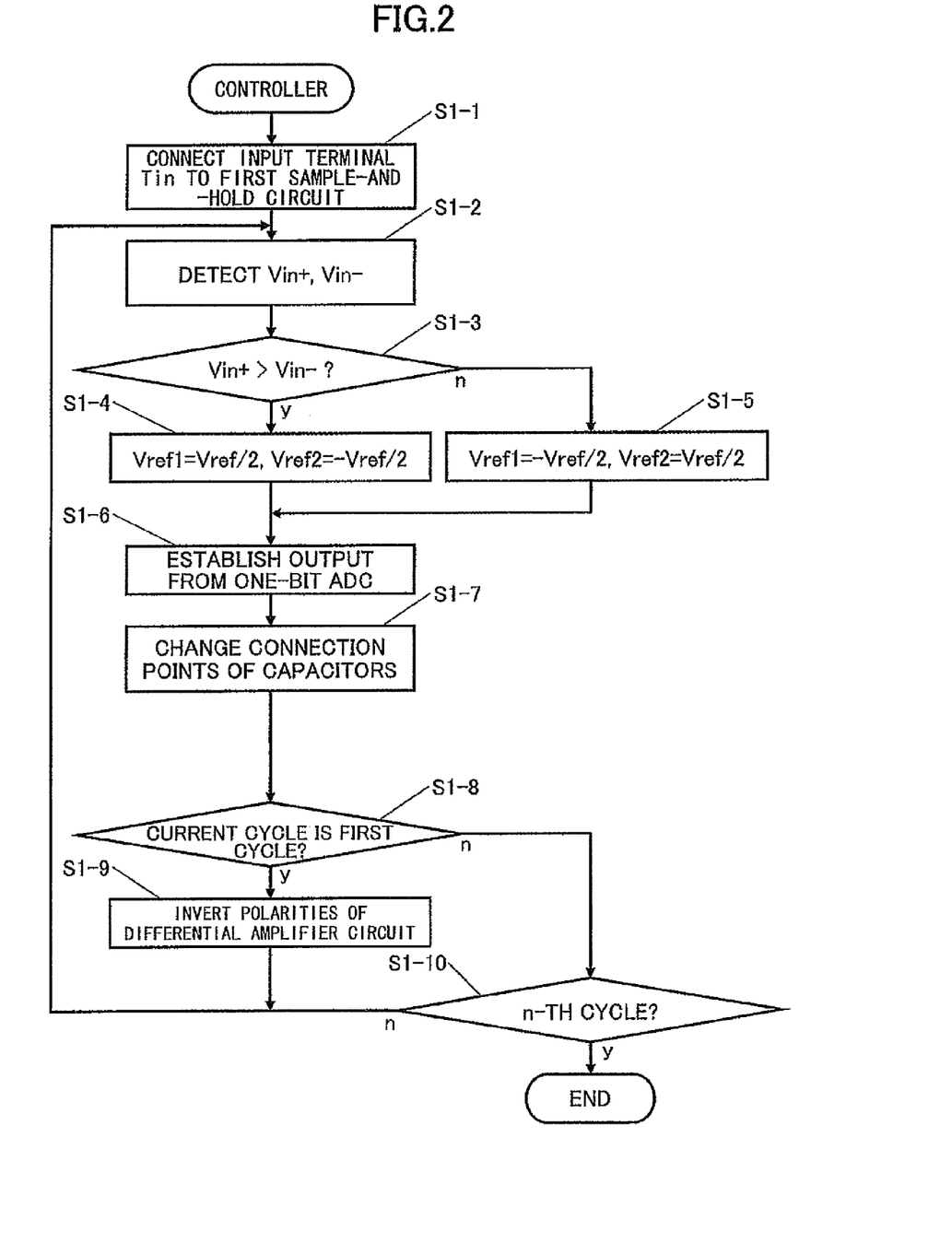
FIG. 2 is a process flowchart of a controller 116.
Figure 3:
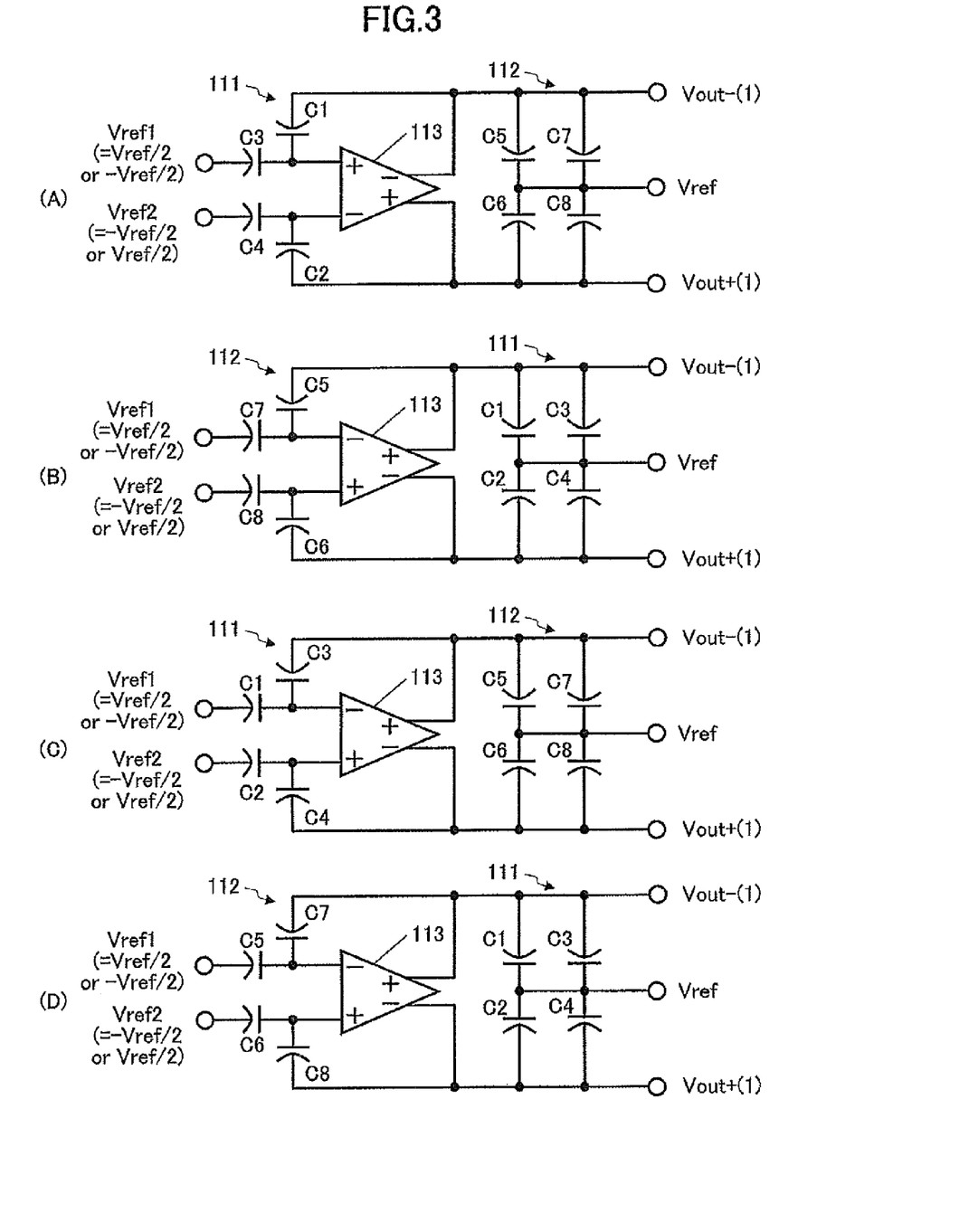
FIG. 3 shows illustration diagrams of a switching operation according to one embodiment of the present invention.
Figure 4:
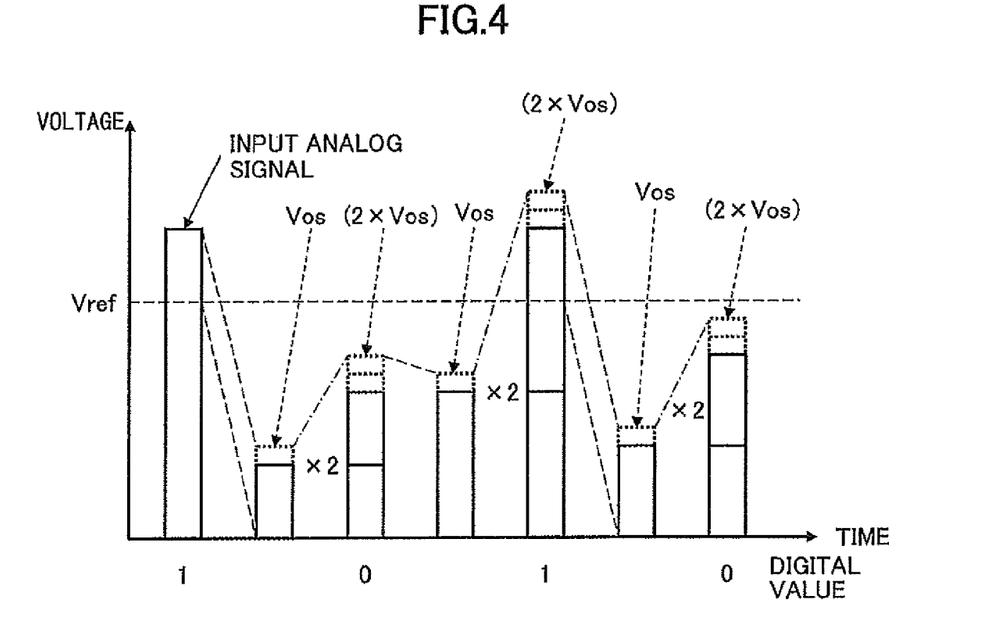
FIG. 4 shows an operation diagram according to the embodiment of the present invention.

FIG. 2 is a process flowchart of the controller 116. FIG. 3 shows illustration diagrams of a switching operation according to one embodiment of the present invention. FIG. 4 shows an operation diagram according to one embodiment of the present invention.

First, in Step S1-1, the controller 116 connects an input terminal $T_{in}$ to the first sample-and-hold circuit 111 so that an input analog signal input to the input terminal $T_{in}$ is sampled and held by the first sample-and-hold circuit 111.

Next, in Step S1-2, the controller 116 connects the capacitors C1-C8 of the first sample-and-hold circuit 111 and the second sample-and-hold circuit 112 to the differential amplifier circuit 113 in a manner as shown in FIG. 3(A), and detects a non-inverting input voltage $V_{in+}$ and an inverting input voltage $V_{in-}$ of the input signal. Then, in Step S1-3, the controller 116 determines whether $V_{in+}$ is larger than $V_{in-}$, i.e. ($V_{in+}>V_{in-}$). If $V_{in+}$ is larger than $V_{in-}$ in Step S1-3, the controller 116 sets, in Step S1-4, an non-inverting input bias voltage $V_{ref1}$ to the first sample-and-hold circuit 111 to be equal to ($V_{ref}/2$), i.e. $V_{ref1}=(V_{ref}/2)$, and sets an inverting input bias voltage $V_{ref2}$ to the first sample-and-hold circuit 111 to be equal to $-(V_{ref}/2)$ i.e. $V_{ref2}=-(V_{ref}/2)$. Note here that $V_{ref}$ is a center voltage of the AD conversion.

If $V_{in+}$ is equal to or smaller than i.e. ($V_{in+}<V_{in-}$) in Step S1-3, the controller 116 sets, in Step S1-5, the non-inverting input bias voltage $V_{ref1}$ to the first sample-and-hold circuit 111 to be equal to $-(V_{ref}/2)$ i.e. $V_{ref1}=-(V_{ref}/2)$, and sets the inverting input bias voltage $V_{ref2}$ to the first sample-and-hold circuit 111 to be equal to $(V_{ref}/2)$, i.e. $V_{ref2}=(V_{ref}/2)$.

Accordingly, in FIG. 3(A), $V_{ref1}=V_{ref}/2$ or $-V_{ref}/2$; and $V_{ref2}=-V_{ref}/2$ or $V_{ref}/2$.

Next, in Step S1-6, the controller 116 establishes a one-bit output from the one-bit ADC 114.

The one-bit ADC 114 compares an output voltage $V_{out}$ ($V_{out}=(V_{out-}-V_{out+})$ of the differential amplifier circuit 113 with $V_{ref}$, and outputs "0" if $V_{out}<V_{ref}$ and outputs "1" if $V_{out}>V_{ref}$.

Subsequently, in Step S1-7, the controller 116 connects the capacitors C1-C8 of the first sample-and-hold circuit 111 and the second sample-and-hold circuit 112 to the differential amplifier circuit 113 in a manner as shown in FIG. 3(B).

According to Steps S1-4 and S1-5, similar to the above-described operation, in FIG. 3(B), $V_{ref1}=V_{ref}/2$ or $-V_{ref}/2$; and $V_{ref2}=-V_{ref}/2$ or $V_{ref}/2$.

In Step S1-8, the controller 116 determines whether the current cycle is the first cycle of the signal through the differential amplifier circuit 113.

If the current cycle is the first cycle in Step S1-8, the controller 116 inverts, in Step S1-9, the polarities of the differential amplifier circuit 113 so as to be changed from the polarity pattern shown in FIG. 3(A) to that shown in FIG. 3(B), and then returns to Step S1-3 and continues the process. If the current cycle is the second cycle or later in Step S1-8, the controller 116 determines, in Step S1-9, whether it is the n-th cycle. Note that "n" is a predetermined positive integer set in accordance with the number of bits of the output digital data.

The controller 116 repeats Steps S1-2 to S1-10 until the amplification operation by the differential amplifier circuit 113 is performed n times. When the amplification operation by the differential amplifier circuit 113 is performed n times, the controller 116 determines that the conversion operation is finished and accordingly finishes the process.

Note here that due to Step S1-7, the connection pattern in Step S1-6 of the first cycle, as shown in FIG. 3(A), has been changed in Step S1-6 of the second cycle to the connection pattern of FIG. 3(B). That is, the first sample-and-hold circuit 111 is connected to the output side of the differential amplifier circuit 113, and the second sample-and-hold circuit 112 is connected to the input side of the differential amplifier circuit 113.

Similarly, due to Step S1-7, the connection pattern in Step S1-6 of the second cycle, as shown in FIG. 3(B), has been changed in Step S1-6 of the third cycle to the connection pattern of FIG. 3(C). That is, the first sample-and-hold circuit 111 is connected to the input side of the differential amplifier circuit 113, and the second sample-and-hold circuit 112 is connected to the output side of the differential amplifier circuit 113.

Similarly, due to Step S1'7, the connection pattern in Step S1-6 of the third cycle, as shown in FIG. 3(C), has been changed in Step S1-6 of the fourth cycle to the connection pattern of FIG. 3(D). That is, the first sample-and-hold circuit 111 is connected to the output side of the differential amplifier circuit 113, and the second sample-and-hold circuit 112 is connected to the input side of the differential amplifier circuit 113.

Similarly, due to Step S1-7, the connection pattern in Step S1-6 of the fourth cycle, as shown in FIG. 3(D), has been changed in Step S1-6 of the fifth cycle to the connection pattern of FIG. 3(A). That is, the first sample-and-hold circuit 111 is connected to the input side of the differential amplifier circuit 113, and the second sample-and-hold circuit 112 is connected to the output side of the differential amplifier circuit 113.

Subsequently, in a similar manner, the connection pattern is sequentially changed to that of FIG. 3(B), and then to that of FIG. 3(C), and so on, according to Step S1-7 each time the number of cycles increases. That is, with the increment in the number of cycles, the connection points of the capacitors C1-C8 are changed so that the connection patterns of FIGS. 3(A), 3(B), 3(C) and 3(D) are sequentially and repeatedly obtained.

In addition, due to Step S1-9, the connection relationship between the inverting input terminal and the non-inverting input terminal and between the inverted output terminal and the non-inverted output terminal of the differential amplifier circuit 113 are changed in the first cycle, as shown in FIG. 3(A), and in the second and subsequent cycles, as shown in FIGS. 3(B)-3(D).

According to Steps S1-4 and S1-5, similar to the above-described operation, in FIG. 3(C), $V_{ref1} = V_{ref}/2$ or $-V_{ref}/2$; and $V_{ref2} = -V_{ref}/2$ or $V_{ref}/2$. Similarly in FIG. 3(D)

$V_{ref1} = V_{ref}/2$ or $-V_{ref}/2$; and $V_{ref2} = -V_{ref}/2$ or $V_{ref}/2$.

The reason to change the inversion relationship in the first cycle and in the second and subsequent cycles is that, even if the voltage including an offset component, $V_{os}$, of the differential amplifier circuit 113 is doubled and then output in the first cycle as shown in FIG. 4, the change of the inversion relationship maintains the offset component at $V_{os}$.

As shown in FIG. 4, for example, the offset component of the differential amplifier circuit 113 is doubled in the first cycle to be ($2V_{os}$). However, because in the second cycle, the inversion relationships between the inverting input terminal and the non-inverting input terminal and between the inverted output terminal and the non-inverted output terminal are changed, the offset component is reduced to ($2V_{os}$)−$V_{os}$=$V_{os}$, which is then doubled to be ($2V_{os}$). Similarly, after the second cycle, the offset component is reduced to $V_{os}$ and then doubled. Therefore, the offset component superposed on a signal, which signal is used for determinations made after the cycles through the differential amplifier circuit 113 corresponds to only the offset component of the differential amplifier circuit 113. As a result, the AD conversion accuracy can be improved.

Also in the present embodiment, when the capacitors C1-C8 are connected to the input side of the differential amplifier circuit 113 in Step S1-7, the positions of the capacitors C1 and C3 and of the capacitors C2 and C4 are switched as shown in FIGS. 3(A) and 3(C), and the positions of the capacitors C5 and C7 and of the capacitors C6 and C8 are switched as shown in FIGS. 3(B) and 3(D).

Figure 5:
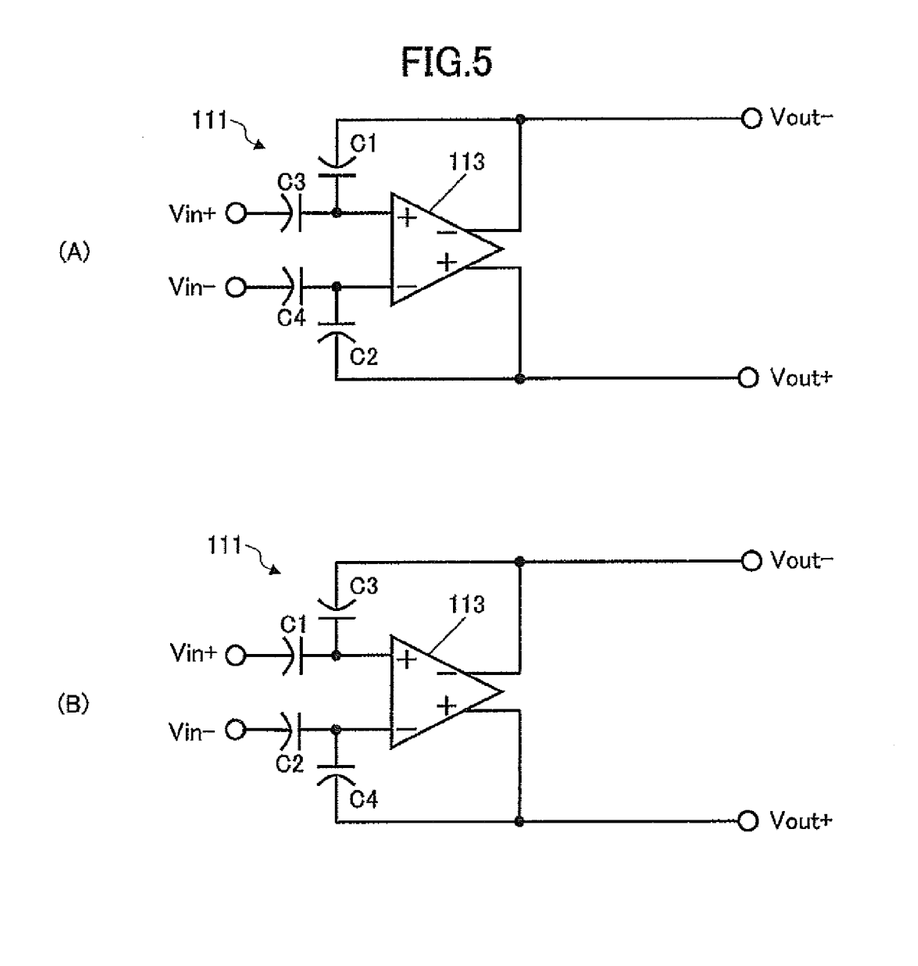
FIG. 5 illustrates effects of the embodiment of the present invention.
Figure 6:
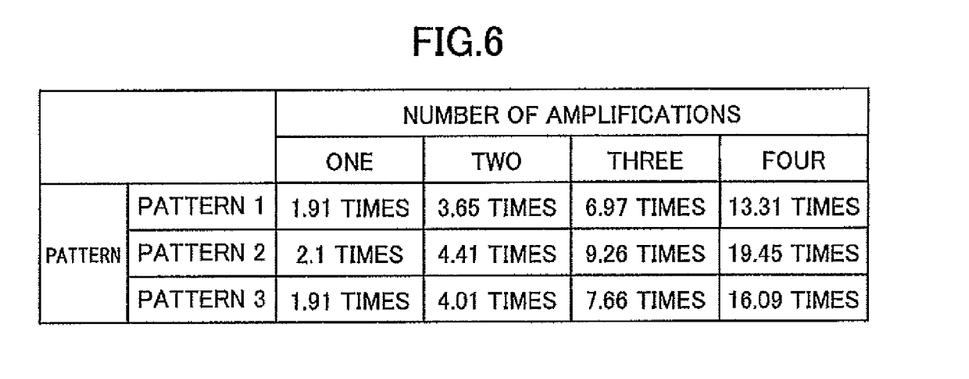
FIG. 6 illustrates effects of the embodiment of the present invention.

FIGS. 5 and 6 illustrate effects of the embodiment of the present invention. In FIG. 5, the same reference numerals are given to the components which are common to those of FIG. 3, and their explanations are omitted. In FIG. 5, the capacitors C1 and C2 are set as C1=C2=C and the capacitors C3 and C4 are set as C3=C4=1.1C in order to introduce a deviation.

FIG. 6 shows a comparison of amplification degrees among the cases in which a pattern 1 illustrated in FIG. 5(A) is repeated, a pattern 2 illustrated in FIG. 5(B) is repeated, and the pattern 1 of FIG. 5(A) and the pattern 2 of FIG. 5(B) are repeated.

As shown in FIG. 6, if the amplification operation is performed once with the pattern 1 of FIG. 5(A), the output voltage is 1.91 times the input voltage. If the amplification operation is performed twice, the output voltage becomes 1.91 1.91=3.65 times the input voltage. With three times, the output voltage becomes 3.65 1.91=6.97 times the input voltage. With four times, the output voltage becomes 6.97 1.91 = 13.31 times the input voltage. While the output voltage becomes 16.0 times the input voltage in the case of amplifying four times with an amplification degree of 2.0, the output voltage becomes only 13.31 times the input voltage in the case of amplifying four times with the pattern 1 of FIG. 5(A). Thus, the desired amplification degree cannot be achieved, reducing the AD conversion accuracy.

In addition, as shown in FIG. 6, if the amplification operation is performed once with the pattern 2 of FIG. 5(B), the output voltage is 2.1 times the input voltage. If the amplification operation is performed twice, the output voltage becomes 2.1 2.1=4.41 times the input voltage. With three times, the output voltage becomes 4.41 2.1=9.26 times the input voltage. With four times, the output voltage becomes 9.26 2.1=19.45 times the input voltage. While the output voltage becomes 16.0 times the input voltage in the case of amplifying four times with an amplification degree of 2.0, the output voltage becomes 19.45 times the input voltage in the case of amplifying four times with the pattern 2 of FIG. 5(B). Thus, the desired amplification degree cannot be achieved, reducing the AD conversion accuracy.

On the other hand, as shown in FIG. 6, if the amplification operation is performed once with the pattern 1 of FIG. 5(A), the output voltage is 1.91 times the input voltage. Next, if the amplification operation is performed with the pattern 2 of FIG. 5(B), the output voltage becomes 1.9 2.1=4.01 times the input voltage. Then, if the amplification operation is performed with the pattern 1 of FIG. 5(A), the output voltage becomes 4.01 1.91=7.66 times the input voltage. Next, if the amplification operation is performed with the pattern 2 of FIG. 5(B), the output voltage becomes 7.66 2.1=16.09 times the input voltage. While the output voltage becomes 16.0 times the input voltage in the case of amplifying four times with an amplification degree of 2.0, the output voltage becomes 16.09 times the input voltage in the case of amplifying four times with the alternation of the pattern 1 of FIG. 5(A) and the pattern 2 of FIG. 5(B). Thus, the obtained amplification degree of 16.01 is significantly close to the desired amplification degree 16.0. In this manner, the AD conversion accuracy can be improved.

Thus, the deviation in capacity of the capacitors can be absorbed, and therefore, the AD conversion accuracy can be further improved.

Note that, for ease of explanation, the one-bit ADC for sequentially performing conversion and outputting a one-bit digital value is employed in the above embodiment; however, the present invention can also be applied to 1.5-bit or greater ADCs.

Figure 7:
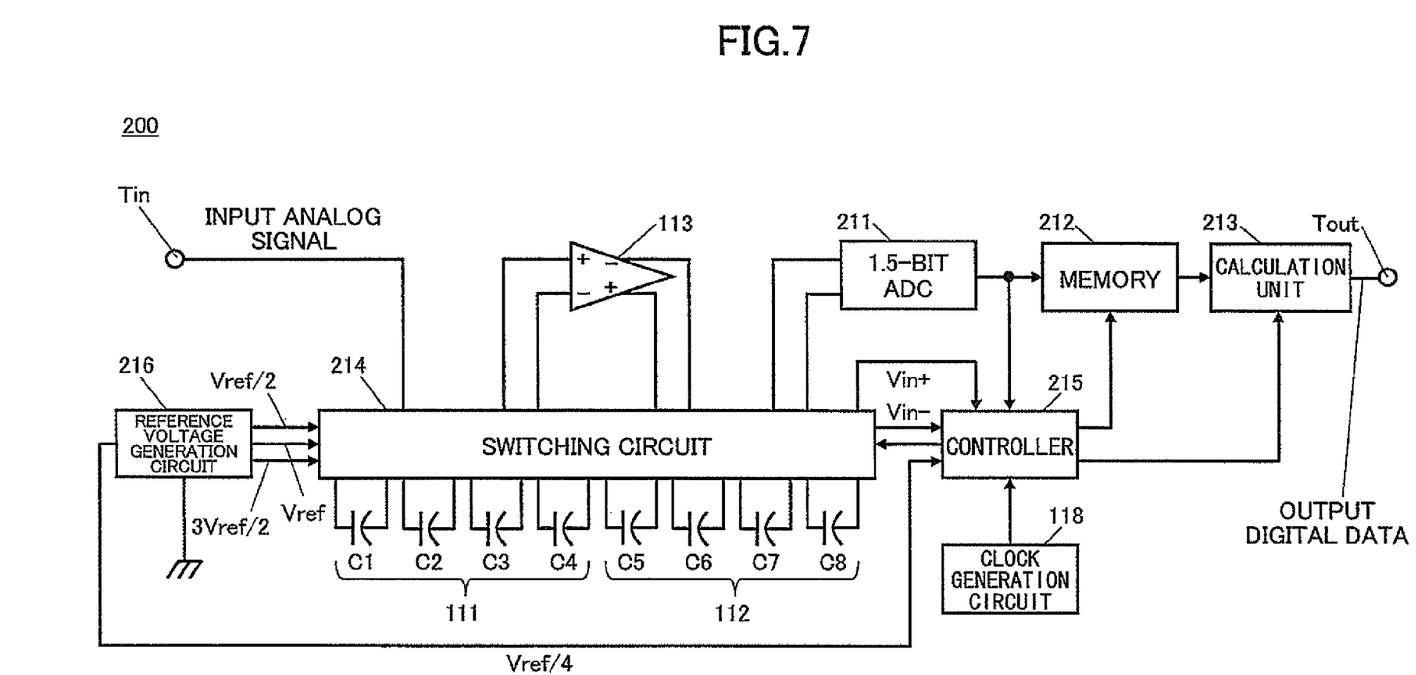
FIG. 7 shows a block configuration diagram according to another embodiment of the present invention.

FIG. 7 shows a block configuration diagram according to another embodiment of the present invention. In FIG. 7, the same reference numerals are given to the components which are common to those of FIG. 1, and their explanations are omitted.

An analog/digital conversion device 200 of the present embodiment is an example in which the present invention is applied to a 1.5-bit ADC. In place of the one-bit analog/digital conversion circuit 114, a 1.5-bit analog/digital conversion circuit 211, a memory 212 and a calculation unit 213 are provided. Also, a switching circuit 214 is provided in place of the switching circuit 115; a controller 215 is provided in place of the controller 116; and a reference voltage generation circuit 216 is provided in place of the reference voltage generation circuit 117.

The reference voltage generation circuit 216 generates reference voltages $V_{ref}/2$, $V_{ref}$ and $3V_{ref}/2$ and supplies them to the switching circuit 214. In accordance with a control signal sent from the controller 215, the switching circuit 214 applies, as reference voltages $V_{ref1}$ and $V_{ref2}$, voltages selected from the reference voltages $V_{ref}/2$, $V_{ref}$ and $3V_{ref}/2$ supplied from the reference voltage generation circuit 216.

Next is described a process performed by the controller 215.

Figure 8:
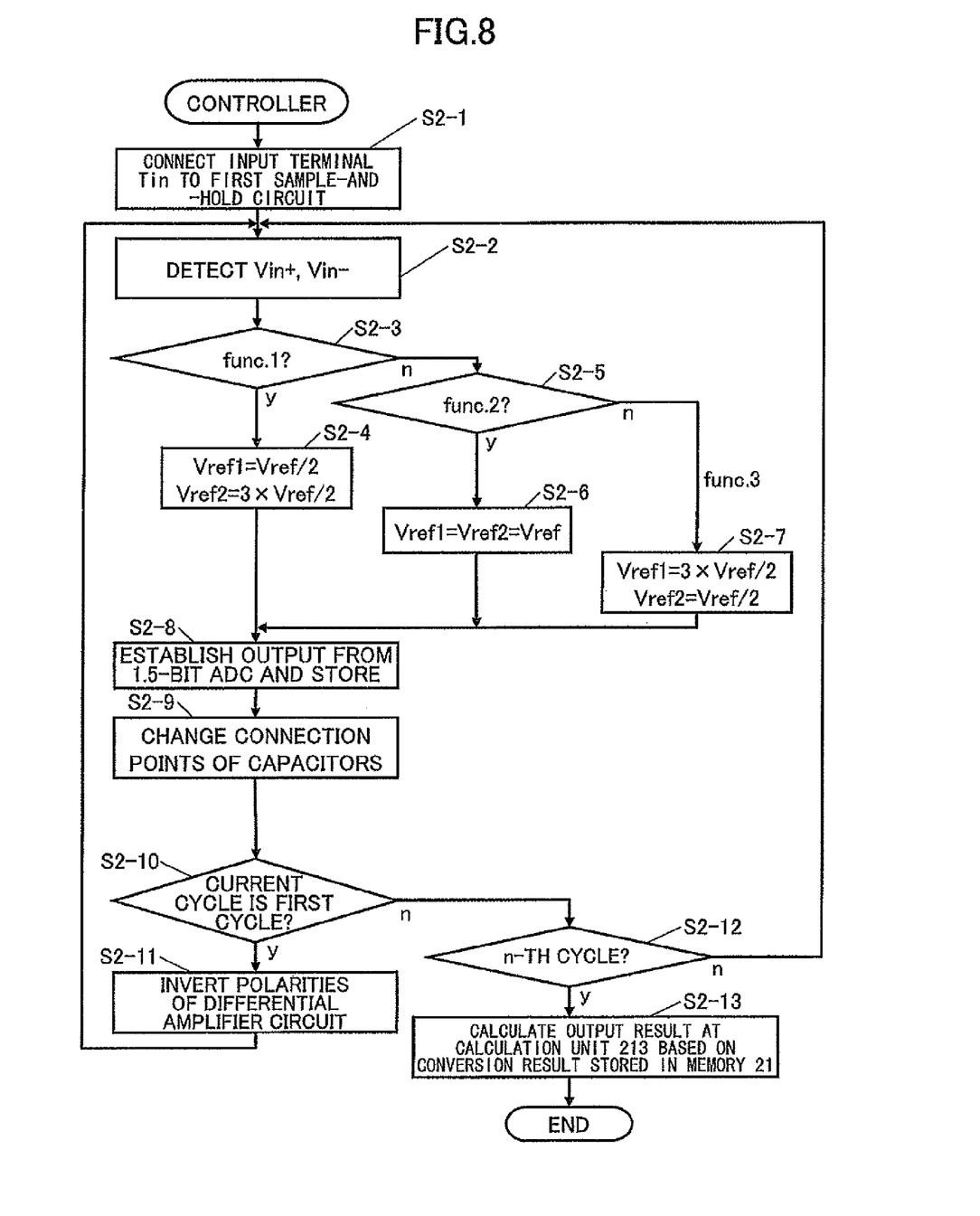
FIG. 8 is a process flowchart of a controller 215.

FIG. 8 is a process flowchart of the controller 215.

First, in Step S2-1, the controller 215 connects the input terminal $T_{in}$ to the first sample-and-hold circuit 111 so that an input analog signal input to the input terminal $T_{in}$ is sampled and held by the first sample-and-hold circuit 111.

Next, in Step S2-2, the controller 215 detects the non-inverting input voltage $V_{in+}$ and the inverting input voltage $V_{in-}$ of the input analog signal, and also receives an input of $(V_{ref}/4)$ from the reference voltage generation circuit 216.

In Steps S2-3 and S2-5, the controller 215 determines a function applied to the input voltages $V_{in+}$ and $V_{in-}$.

For example, if the relationship between the input voltages $V_{in+}$ and $V_{in-}$ and the voltage $(V_{ref}/4)$ satisfies $V_{in+}<(V_{in-}-V_{ref}/4)$, the controller 215 applies a function func.1 to the input voltages $V_{in+}$ and $V_{in-}$. In the case of applying the function func.1 to the input voltages $V_{in+}$ and $V_{in-}$ in Step S2-3, the controller 215 sets, in Step S2-4, the bias voltages $V_{ref1}$ and $V_{ref2}$ applied by the reference voltage generation circuit 216 to the first sample-and-hold circuit 111 or the second sample-and-hold circuit 112 to be:

$$V_{ref1}=V_{ref}/2; \text{ and}$$

$$V_{ref2}=3V_{ref}/2.$$

If the relationship between the input voltages $V_{in+}$ and $V_{in-}$ and the voltage $(V_{ref}/4)$ satisfies $|(V_{in+}-V_{in-})|<(V_{ref}/4)$, the controller 215 applies a function func.2 to the input voltages $V_{in+}$ and $V_{in-}$. In the case of applying the function func.2 to the input voltages $V_{in+}$ and $V_{in-}$ in Step S2-5, the controller 215 sets, in Step S2-6, the bias voltages $V_{ref1}$ and $V_{ref2}$ applied by the reference voltage generation circuit 216 to the first sample-and-hold circuit 111 or the second sample-and-hold circuit 112 to be:

$$V_{ref1}=V_{ref2}=V_{ref}.$$

If the relationship between the input voltages $V_{in+}$ and $V_{in-}$ and the voltage $(V_{ref}/4)$ satisfies $V_{in+}>(V_{in-}+V_{ref}/4)$ the controller 215 applies a function func.3 to the input voltages $V_{in+}$ and $V_{in-}$. In the case of applying the function func.3 to the input voltages $V_{in+}$ and $V_{in-}$ in Step S2-5, the controller 215 sets, in Step S2-7, the bias voltages $V_{ref1}$ and $V_{ref2}$ applied by the reference voltage generation circuit 216 to the first sample-and-hold circuit 111 or the second sample-and-hold circuit 112 to be:

$$V_{ref1}=3V_{ref}/2; \text{ and}$$

$$V_{ref2}=2V_{ref}/3.$$

Next, in Step S2-8, the controller 215 performs conversion according to the applied functions func.1, func.2 or func.3 to produce a two-bit digital value. In the case of $V_{in+}<(V_{in-}-V_{ref}/4)$ where, for example, $V_{in+}$ is a non-inverting input and $V_{in-}$ is an inverting input, i.e. in the case where the function func.1 is applied, the 1.5-bit ADC 211 outputs a digital value of "0,0". In the case of $|(V_{in+}-V_{in-})|<(V_{ref}/4)$, i.e. in the case where the function func.2 is applied, the 1.5-bit ADC 211 outputs a digital value of "0,1".

In the case of $V_{in+}>(V_{in-}+V_{ref}/4)$, i.e. in the case where the function func.3 is applied, the 1.5-bit ADC 211 outputs a digital value of "1,0".

The digital value output from the 1.5-bit ADC 211 is stored in the memory 212.

Next, in Step S2-9, the controller 215 controls the switching circuit 214 so that the connection of the capacitors C1-C8 is changed from the pattern shown in FIG. 3(A) to that shown in FIG. 3(B).

In Step S2-10, the controller 215 determines whether the current cycle is the first cycle.

If the current cycle is the first cycle in Step S2-10, the controller 215 controls, in Step S2-11, the switching circuit 214 to invert the polarities of the differential amplifier circuit 113 so as to be changed from the pattern of FIG. 3(A) to that of FIG. 3(B), and then returns to Step S2-2 and continues the process. Note here that due to Step S2-11, the connection pattern in the first cycle, as shown in FIG. 3(A), has been changed in the second cycle to the connection pattern of FIG. 3(B). That is, the first sample-and-hold circuit 111 is connected to the output side of the differential amplifier circuit 113, and the second sample-and-hold circuit 112 is connected to the input side of the differential amplifier circuit 113. In addition, due to Step S2-11, the connection relationships between the inverting input terminal and the non-inverting input terminal and between the inverted output terminal and the non-inverted output terminal of the differential amplifier circuit 113 are changed in the first cycle, as shown in FIG. 3(A), and in the second and subsequent cycles, as shown in FIGS. 3(B)-3(D).

Accordingly, the offset component of the differential amplifier circuit 113 is maintained at $V_{os}$.

If the current cycle is the second cycle or later in Step S2-10, the controller 215 determines, in Step S2-12, whether the current cycle is the n-th cycle.

The controller 215 repeats Steps S2-2 to S2-12 until the amplification operation by the differential amplifier circuit 113 is performed n times. When the amplification operation by the differential amplifier circuit 113 is performed n times, the controller 215 determines that the conversion operation is finished.

When determining in Step S2-12 that the current cycle is the n-th cycle, the controller 215 determines that the process by the 1.5-bit ADC 211 is finished, and reads, in Step S2-13, conversion results of the 1.5-bit ADC 211 for the respective cycles from the memory 212 that stores them. The controller 215 supplies the read conversion results to the calculation unit 213 and determines an output digital value.

Figure 9:
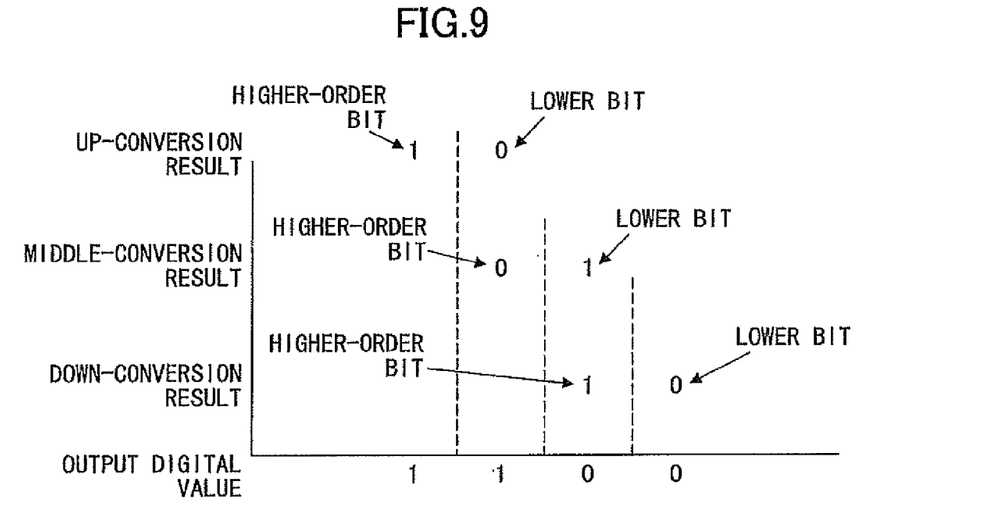
FIG. 9 illustrates a calculation operation performed by a calculation unit 213.

FIG. 9 illustrates a calculation operation performed by the calculation unit 213.

In FIG. 9, an up-conversion result for the first conversion in the 1.5-bit ADC 211 is "1,0", a middle-conversion result for the second conversion is "0,1" and a down-conversion result for the subsequent conversion is "1,0".

The lower bit of the up-conversion result is aligned with the higher-order bit of the middle-conversion result while the lower bit of the middle-conversion result is aligned with the higher-order bit of the down-conversion result, and in this manner, the up-conversion result, the middle-conversion result and the down-conversion result are added together. The addition result of FIG. 9 is "1100". The controller 215 outputs the calculation result of the calculation unit 213 as an output digital value.

The operation of the present embodiment is explained using mathematical expressions.

Figure 10:
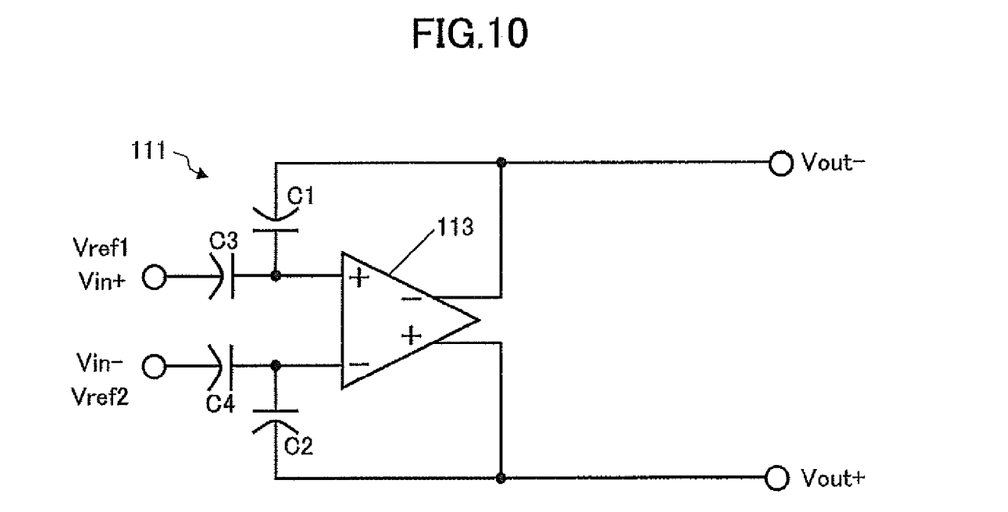
FIG. 10 shows an operational diagram according to the other embodiment of the present invention.

FIG. 10 shows an operational diagram according to the other embodiment of the present invention.

Referring to FIG. 10, the non-inverting input, the inverting input, the inverted output and the non-inverted output of the differential amplifier circuit 113 are $V_{in+}$, $V_{in-}$, $V_{out-}$ and $V_{out+}$, respectively; the bias voltage of the non-inverting input terminal is $V_{ref1}$; the bias voltage of the inverting input terminal is $V_{ref2}$; the capacitors are C1-C4 where C1=C2=C3=C4; and the reference voltage is $V_{ref}$. In this case, the inverted output $V_{out-}$ and the non-inverted output $V_{out+}$ of the differential amplifier circuit 113 are expressed by the following equations:

$$V_{out-} = V_{ref1} - (V_{ref1} - V_{in+})(1+C3/C1) \quad (1); \text{ and}$$

$$V_{out+} = V_{ref2} - (V_{ref2} - V_{in-})(1+C4/C2) \quad (2).$$

$$\text{If } V_{in+} < V_{in-} - (V_{ref}/4) \quad (3),$$

$$V_{ref1} = V_{ref}/2 \quad (4); \text{ and}$$

$$V_{ref2} = 3V_{ref}/2 \quad (5).$$

According to the equation (1), the non-inverted output $V_{out+}$ is:

$$V_{out+} = 2V_{in+} - 3(V_{ref}/2) \quad (6).$$

According to the equation (2), the inverted output $V_{out-}$ is:

$$V_{out-} = 2V_{in-} - (V_{ref}/2) \quad (7)$$

Thus, according to the equations (6) and (7), the differential output $V_{out} = V_{out+} - V_{out-}$ is:

$$V_{out} = 2(V_{in+} - V_{in-}) + V_{ref} \quad (8).$$

$$\text{If } |(V_{in+} - V_{in-})| < (V_{ref}/4) \quad (9),$$

$$V_{ref1} = V_{ref2} = V_{ref} \quad (10).$$

According to the equation (1), the non-inverted output $V_{out+}$ is:

$$V_{out+} = 2V_{in+} - V_{ref} \quad (11).$$

According to the equation (2), the inverted output $V_{out-}$ is:

$$V_{out-} = 2V_{in-} - V_{ref} \quad (12).$$

Thus, according to the equations (11) and (12), the differential output $V_{out} = V_{out+} - V_{out-}$ is:

$$V_{out} = 2(V_{in+} - V_{in-}) \quad (13).$$

$$\text{If } V_{in+} > V_{in-} + (V_{ref}/4) \quad (14),$$

$$V_{ref1} = 3V_{ref}/2 \quad (15), \text{ and}$$

$$V_{ref2} = V_{ref}/2 \quad (16).$$

According to the equation (1), the non-inverted output $V_{out+}$ is:

$$V_{out+} = 2V_{in+} - (V_{ref}/2) \quad (17).$$

According to the equation (2), the inverted output $V_{out-}$ is:

$$V_{out-} = 2V_{in-} - 3(V_{ref}/2) \quad (18).$$

Thus, according to the equations (17) and (18), the differential output $V_{out} = V_{out+} - V_{out-}$ is:

$$V_{out} = 2(V_{in+} - V_{in-}) - V_{ref} \quad (19).$$

Figure 11:
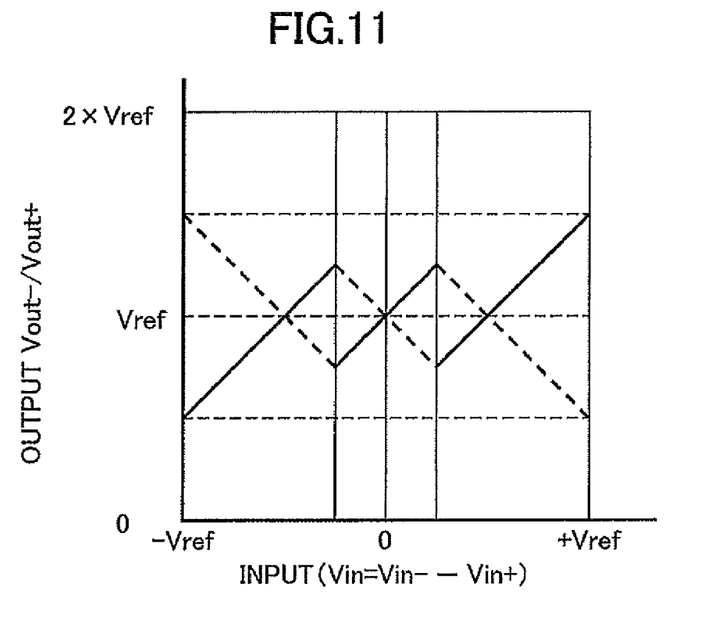
FIG. 11 illustrates the relationship of outputs $V_{out+}$ and $V_{out-}$ with an input ($V_{in-}-V_{in+}$)
Figure 12:
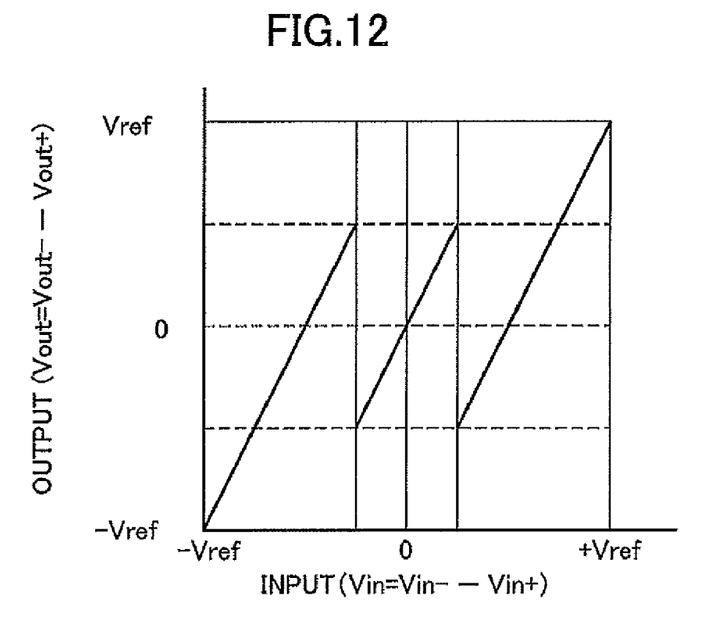
FIG. 12 illustrates the relationship of an output ($V_{out-}-V_{out+}$) with an input ($V_{in-}-V_{in+}$)

FIG. 11 illustrates the relationship of the outputs $V_{out+}$ and $V_{out-}$ with the input $(V_{in-} - V_{in+})$. FIG. 12 illustrates the relationship of the output $(V_{out-} - V_{out+})$ with the input $(V_{in-} - V_{in+})$.

In FIG. 11, the solid line indicates $V_{out-}$ and the dotted line indicates $V_{out+}$.

The relationship of the input $(V_{in-} - V_{in+})$ with the outputs $V_{out+}$ and $V_{out-}$ is one, as illustrated in FIG. 11, according to the equations (6), (7) and (8) and the equations (11), (12) and (13), while the relationship of the input $(V_{in-} - V_{in+})$ with the output $(V_{out-} - V_{out+})$ is one, as illustrated in FIG. 12, according to the equations (6), (7) and (8) and the equations (17), (18) and (19).

Thus, with the 1.5-bit AD conversion, large displacement of the output $(V_{out-} - V_{out+})$ can be obtained with respect to the input $(V_{in-} - V_{in+})$, which results in an improvement of detection accuracy.

Note that the present invention is not limited to one-bit AD conversion and 1.5-bit AD conversion, and is also applicable to 2-bit or greater cyclic AD conversion.

Note that the present invention is not limited to the above-described embodiments, and it should be understood that various modification may be considered without departing from the scope of the present invention.

This application is based upon and claims the benefit of priority of Japanese Patent Application 2006-236025, filed on Aug. 31, 2006, the entire contents of which are hereby incorporated herein by reference.

The invention claimed is:

1. An analog/digital conversion apparatus for converting an analog signal into digital data by cycling the analog signal through a fully differential amplifier circuit, the analog/digital conversion circuit comprising:
    a polarity switching unit configured to switch connection polarities of the fully differential amplifier circuit; and
    a control unit configured to control the polarity switching unit in such a manner that the connection polarities of the fully differential amplifier circuit are switched between a first signal cycle and a second cycle, and are maintained in the second and subsequent cycles.

2. The analog/digital conversion apparatus as claimed in claim 1, further comprising:
    a sample-and-hold circuit configured to sample and hold the analog signal cycled through the fully differential amplifier circuit and including a plurality of capacitors which are charged at the same potential and are connected to the fully differential amplifier circuit at different connection points; and
    a capacitor switching unit configured to switch the connection points of the capacitors;
    wherein the control unit controls the capacitor switching unit in such a manner that the connection points of the capacitors are different in each cycle.

3. The analog/digital conversion apparatus as claimed in claim 1, wherein the analog/digital conversion apparatus is an algorithmic analog/digital conversion circuit.

4. An analog/digital conversion apparatus for converting an analog signal into digital data comprising:
    a sample-and-hold circuit including a plurality of capacitors which are charged at the same potential and configured to sample and hold the analog signal;
    a fully differential amplifier circuit configured to amplify the analog signal sampled and held by the sample-and-hold circuit;
    an analog/digital conversion circuit configured to convert the analog signal sampled and held by the sample-and-hold circuit into a digital value in accordance with a reference voltage;
    a switching circuit configured to switch connection points of the capacitors with the fully differential amplifier circuit; and
    a control unit configured to control the switching circuit in such a manner that connection polarities of the fully differential amplifier circuit are switched between a first signal cycle and a second cycle, and are maintained in the second and subsequent cycles.

5. The analog/digital conversion circuit as claimed in claim 4, wherein the control unit controls the switching circuit in such a manner that the connection points of the capacitors are different in each cycle.

\* \* \* \* \*